(12) United States Patent
Chiu et al.

(10) Patent No.: US 10,667,406 B2
(45) Date of Patent: May 26, 2020

(54) CIRCUIT BOARD AND METHOD FOR MANUFACTURING THE SAME

(71) Applicant: Unimicron Technology Corp., Taoyuan (TW)

(72) Inventors: Cheng-Chieh Chiu, Taoyuan (TW);
Chia-Chan Chang, New Taipei (TW);
Chun-Yi Kuo, Taoyuan (TW);
Yu-Cheng Lin, New Taipei (TW)

(73) Assignee: UNIMICRON TECHNOLOGY CORP., Taoyuan (TW)

( * ) Notice: Subject to any disclaimer, the term of this patent is extended or adjusted under 35 U.S.C. 154(b) by 0 days.

(21) Appl. No.: 16/132,462

(22) Filed: Sep. 16, 2018

(65) Prior Publication Data

US 2019/0021171 A1    Jan. 17, 2019

Related U.S. Application Data

(62) Division of application No. 15/820,397, filed on Nov. 21, 2017, now abandoned, which is a division of application No. 15/361,075, filed on Nov. 25, 2016, now abandoned.

(30) Foreign Application Priority Data

Sep. 27, 2016   (CN) .......................... 2016 1 0852933

(51) Int. Cl.
*H05K 1/11* (2006.01)
*H05K 3/06* (2006.01)
*H05K 3/40* (2006.01)
*H05K 3/46* (2006.01)

(52) U.S. Cl.
CPC ............. *H05K 3/061* (2013.01); *H05K 1/113* (2013.01); *H05K 1/115* (2013.01); *H05K 3/4007* (2013.01); *H05K 3/4038* (2013.01); *H05K 3/4647* (2013.01); *H05K 3/4682* (2013.01); *H05K 2201/096* (2013.01); *H05K 2203/0502* (2013.01)

(58) Field of Classification Search
CPC .... H05K 3/061; H05K 3/4682; H05K 3/4647; H05K 3/4007; H05K 1/113; H05K 3/4038; H05K 2203/0502
See application file for complete search history.

(56) References Cited

U.S. PATENT DOCUMENTS

| | | | | |
|---|---|---|---|---|
| 7,964,106 B2 * | 6/2011 | Chen | .................... | H01L 21/4857 216/13 |
| 9,117,697 B2 * | 8/2015 | Lee | .......................... | H01L 24/11 |
| 2013/0098670 A1 * | 4/2013 | Inoue | .................... | H05K 3/4007 174/264 |
| 2014/0332253 A1 * | 11/2014 | Lin | ....................... | H05K 3/0097 174/251 |

* cited by examiner

*Primary Examiner* — Ishwarbhai B Patel
(74) *Attorney, Agent, or Firm* — CKC & Partners Co., LLC

(57) ABSTRACT

A circuit board element includes a glass substrate, a first dielectric layer, and a first patterned metal layer. The glass substrate has an edge. The first dielectric layer is disposed on the glass substrate and has a central region and an edge region. The edge region is in contact with the edge of the glass substrate, and the thickness of the central region is greater than the thickness of the edge region. The first patterned metal layer is disposed on the glass substrate and in the central region of the first dielectric layer.

1 Claim, 8 Drawing Sheets

CIRCUIT BOARD AND METHOD FOR MANUFACTURING THE SAME

RELATED APPLICATIONS

This application is a Divisional Application of the U.S. application Ser. No. 15/820,397, filed Nov. 21, 2017, which is now abandoned, which is a Divisional Application of the U.S. application Ser. No. 15/361,075, filed Nov. 25, 2016, which is now abandoned, which claims priority to China Application Serial Number 201610852933.2, filed Sep. 27, 2016, all of which are herein incorporated by reference.

BACKGROUND

Technical Field

The present disclosure relates to a circuit board and a method for manufacturing the same.

Description of Related Art

With the rapid growth of the electronics industry, the R & D of electronic products has gradually been directed to the pursuit of versatility and high performance. In order to achieve the requirements of high integration and miniaturization of semiconductor components, the requirements of circuit boards also increase. For example, the pitch of the traces of the circuit board is required to become smaller and smaller, and the thickness of the circuit board is required to become smaller and smaller.

To further improve the circuit boards, persons in the industry have made every endeavor to discover new solutions. The application and improvement of the circuit boards has become one of the most important research topics.

SUMMARY

This disclosure provides a circuit board and a method for manufacturing the same to increase the space for the circuit layer in the circuit board and increase the overall process yield.

In one aspect of the disclosure, a method for manufacturing a circuit board is provided. The method includes: forming a first sacrificial metal layer on a carrier, in which the first sacrificial metal layer has a plurality of first openings; forming a first etching stop layer on the carrier, in which the first etching stop layer covers the first sacrificial metal layer; forming a patterned resist on the first etching stop layer, in which the patterned resist has a plurality of second openings and an intaglioed pattern, the second openings respectively correspond to the first openings to expose a part of the first sacrificial metal layer, and the intaglioed pattern exposes a part of the first etching stop layer; forming a plurality of metal bump in the first openings and the second openings and forming a first circuit layer in the intaglioed pattern; removing the patterned resist; forming a build-up structure on the first etching stop layer, in which the build-up structure includes a dielectric layer, a plurality of conductive vias, and at least one second circuit layer, the dielectric layer covers the metal bumps and the first circuit layer, the conductive vias is formed in the dielectric layer, the second circuit layer is formed on the dielectric layer, the conductive vias connects the first circuit layer and the second circuit layer; a second etching stop layer is formed on the dielectric layer, in which the second etching stop layer covers the second circuit layer; separating the carrier and the first sacrificial metal layer; performing a first etching process to remove the first sacrificial metal layer; and performing a second etching process to remove the first etching stop layer and the second etching stop layer.

In one or more embodiments, the first etching stop layer and the second etching stop layer are made of the same material, and the first etching stop layer and the second etching stop layer are made of tin, titanium, aluminum, or any combination thereof.

In one or more embodiments, the method further includes forming a metal layer on the dielectric layer when the build-up structure is formed. The second etching stop layer further covers the metal layer. The method further includes performing a third etching process to pattern the metal layer after the second etching process is performed.

In one or more embodiments, the method further includes: forming a second sacrificial metal layer on the second etching stop layer; and removing the second sacrificial metal layer when the first sacrificial metal layer is removed.

In one or more embodiments, a thickness of the first sacrificial metal layer is substantially the same with a thickness of the second sacrificial metal layer, and the first sacrificial metal layer and the second sacrificial metal layer are made of the same material.

In one or more embodiments, each of the metal bumps are further divided into a first part and a second part. After the first etching stop layer and the second etching stop layer are removed, the first part is disposed in the dielectric layer, the second part protrudes from the dielectric layer, and a difference between widths of the first part and the second part is less than 4% of the width of the second part.

In one or more embodiments, one of a plurality of the second circuit layers is formed on the dielectric layer, the others of the second circuit layers are formed in the dielectric layer, a part of the conductive vias connect the first circuit layer and the lowermost one of the second circuit layers, and the others of the conductive vias connect the second circuit layers.

In another aspect of the disclosure, a circuit board is provided. The circuit board includes a first dielectric layer, a first circuit layer, a second circuit layer, a conductive via, and a metal bump. The first dielectric layer has a first surface and a second surface opposite to the first surface. The first circuit layer is buried in the first surface. The second circuit layer is disposed on the second surface. The conductive via is disposed in the first dielectric layer and connects the first circuit layer and the second circuit layer. The metal bump has a first part and a second part, in which the first part is disposed in the first dielectric layer, the second part protrudes from the first surface, and a difference between widths of the first part and the second part is less than 4% of the width of the second part.

In one or more embodiments, the circuit board further includes a second dielectric layer disposed on a sidewall of the second part.

In one or more embodiments, an end surface of the first part and an interface between the first circuit layer and the conductive via are coplanar.

In one or more embodiments, an end surface of the first circuit layer exposed by the first surface and the first surface are coplanar.

In one or more embodiments, an edge of the first part is located outside a scope enclosed by an edge of the second part.

In one or more embodiments, an edge of the first part is located in a scope enclosed by an edge of the second part.

In the aforementioned embodiments, the sizes of the metal bumps are effectively controlled, such that the shape of the cross-section of each of the metal bumps is similar to "I", in which the widths of different segments of each of the metal bumps are substantially the same. Therefore, the metal bumps will not occupy the surrounding space, so the space for the circuit layer can be effectively increased.

Further, because the first etching stop layer and the second etching stop layer are made of tin, titanium, aluminum, or other metals that can form an intermetallic compound with copper, the first etching stop layer and the second etching stop layer will not be influenced by the alkaline etching process (the first etching process). Compared to the conventional material nickel, tin, titanium, aluminum, or other metals that can form an intermetallic compound with copper can resist the alkaline etching more effectively, so the cavity will not be formed after the alkaline etching process is performed, such that depressions or cavities may not generated in the metal bumps, the first circuit layer, and the second circuit layer, and an open circuit will not happen.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows:

FIG. 1C' is a schematic cross-sectional view of one of the intermediate operations in the method for manufacturing the circuit board according to another embodiment of this disclosure;

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically depicted in order to simplify the drawings.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1A:
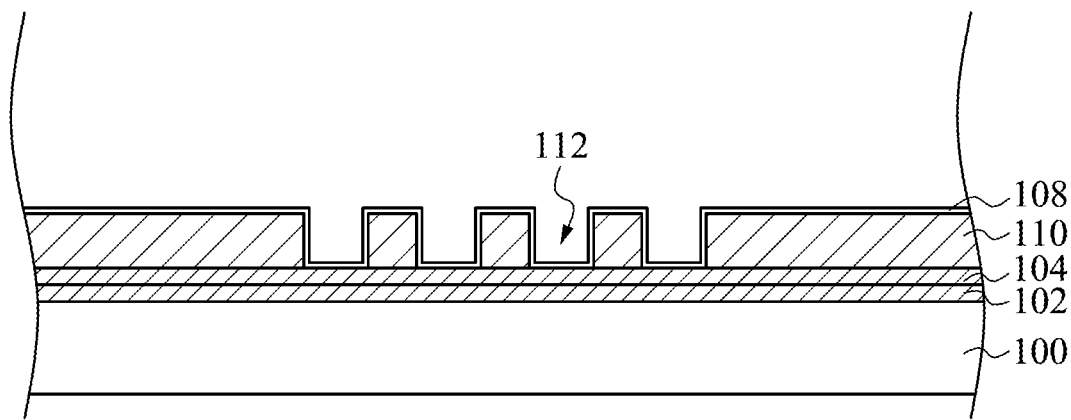
FIGS. 1A to 1F are schematic cross-sectional views of intermediate operations in a method for manufacturing a circuit board according to one embodiment of this disclosure.

FIGS. 1A to 1F are schematic cross-sectional views of intermediate operations in a method for manufacturing a circuit board according to one embodiment of this disclosure. First, as shown in FIG. 1A, a sacrificial metal layer 110 is formed on a carrier 100. In this embodiment, copper foil layers 102 and 104 may be formed on the carrier 100, and a stripping layer disposed between the copper foil layers 102 and 104 (not shown in Figs.) may be formed. Embodiments of this disclosure are not limited thereto. In other embodiments, the copper foil layers 102 and 104 may not be formed on the carrier 100. The thickness of the copper foil layer 102 is, for example, in a range from about 5 μm to about 40 μm, and the thickness of the copper foil layer 104 is, for example, in a range from about 1 μm to about 10 μm. The copper foil layers 102 and 104 may help the separating of the carrier 100 and a circuit board, which is the end product, in the following processes. The sacrificial metal layer 110 has a plurality of openings 112. In the following processes, metal bumps will be formed in the openings 112. The sacrificial metal layer 110 is made of metal, such as copper. Embodiments of this disclosure are not limited thereto. The formation method of the sacrificial metal layer 110 is, for example, an electroplating process. In this embodiment, the openings 112 expose a part of the carrier 100.

Then, an etching stop layer 108 is formed on the carrier 100. The etching stop layer 108 covers the sacrificial metal layer 110 and the part of the carrier 100 exposed by the openings 112. The etching stop layer 108 is made of tin, titanium, aluminum, or other metals that can form an intermetallic compound with copper. The formation method of the etching stop layer 108 is, for example, an electroplating process. In this embodiment, the etching rate of the etching stop layer 108 needs to be smaller than the etching rate of the sacrificial metal layer 110. Therefore, in the following operation of removing the sacrificial metal layer 110 by an etching process, the etching stop layer 108 can protect the metal bumps and the circuit layer covered by the etching stop layer 108.

When the etching stop layer 108 is made of tin, copper ions in the sacrificial metal layer 110 are easy to diffuse into the etching stop layer 108, such that the copper-tin intermetallic compound is formed. When the etching stop layer 108 is made of titanium, the copper-titanium intermetallic compound is not easy to be formed.

When the etching stop layer 108 is made of tin, the operation of forming the etching stop layer 108 includes the following detailed operations. First, a tin layer is formed on the carrier 100, in which the tin layer covers the sacrificial metal layer 110 and the carrier 100 exposed by the openings 112. Then, the tin layer is heated. After the tin layer is heated, the tin layer will chemically react with the sacrificial metal layer 110, which is made of copper, and the copper foil layer 104, such that the tin layer becomes the etching stop layer 108 made of the copper-tin intermetallic compound.

Figure 1B:
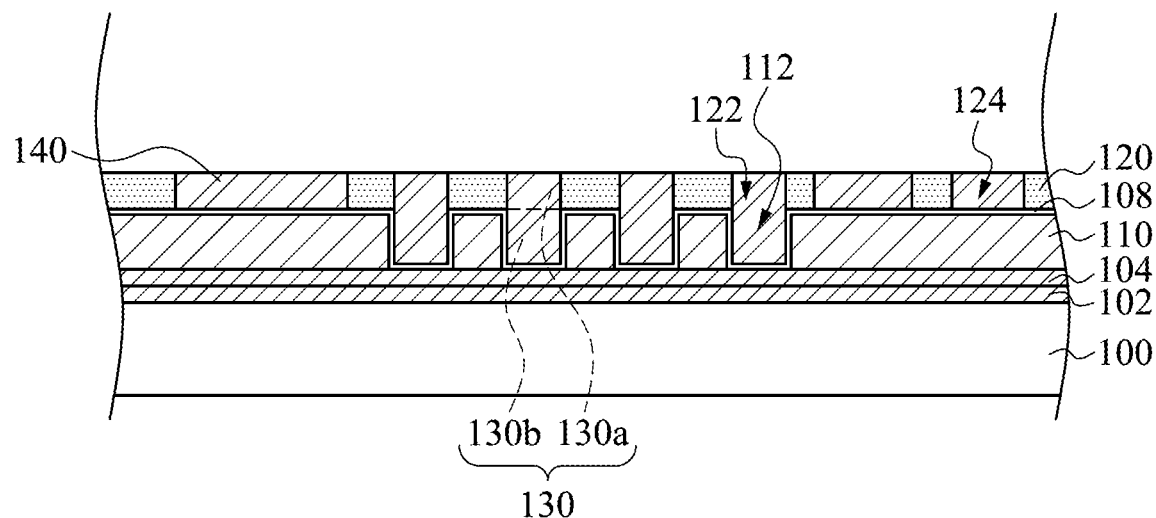

Then, as shown in FIG. 1B, a patterned resist 120 is formed on the etching stop layer 108. The patterned resist 120 is, for example, a dry film or a liquid photoresist. The patterned resist 120 has a plurality of openings 122 corresponding to the openings 112 to expose a part of the etching stop layer 108. Due to the process tolerance in the process of forming the patterned resist 120, the width of the openings 122 and the width of the openings 112 are slightly different. For example, the edge of each of the openings 122 may slightly protrude from the edge of the corresponding one of the openings 112 below (i.e., the width of the openings 122 is slightly greater than the width of the openings 112, and the edge of each of the openings 122 is located outside a scope enclosed by the edge of the corresponding one of the openings 112); alternatively, the edge of each of the openings 122 may slightly depress from the edge of the corresponding one of the openings 112 below (i.e., the width of the openings 122 is slightly less than the width of the openings 112, and the edge of each of the openings 122 is located in a scope enclosed by the edge of the corresponding one of the openings 112). However, no matter the width of the opening 122 is greater or less than the width of the openings 112, the difference between the widths of the openings 112 and 122 is less than 4% of the width of the openings 112.

In addition, because the difference between the widths of the openings 112 and 122 is less than 4% of the width of the openings 112, the edge of each of the openings 122 can be regarded to be aligned with the edge of the corresponding one of the openings 112 (as shown in FIG. 1B, the edge of each of the openings 122 is aligned with the edge of the corresponding one of the etching stop layer 108. Because the thickness of the etching stop layer 108 is small, the edge of each of the openings 122 can be regarded to be aligned with the edge of corresponding one of the openings 112). Furthermore, the patterned resist 120 further has an intaglioed pattern 124 exposing a part of the etching stop layer 108.

Then, a metal layer is formed in the openings 112 and 122 and the intaglioed pattern 124, such that a plurality of metal bump 130 are formed in the openings 112 and 122, and a circuit layer 140 is formed in the intaglioed pattern 124. The metal layer is, for example, a copper layer. The forming method of the metal layer is, for example, an electroplating process. Each of the metal bumps 130 has a first part 130a and a second part 130b, in which the first parts 130a are formed in the openings 122, and the second parts 130b are formed in the openings 112.

Figure 2A:
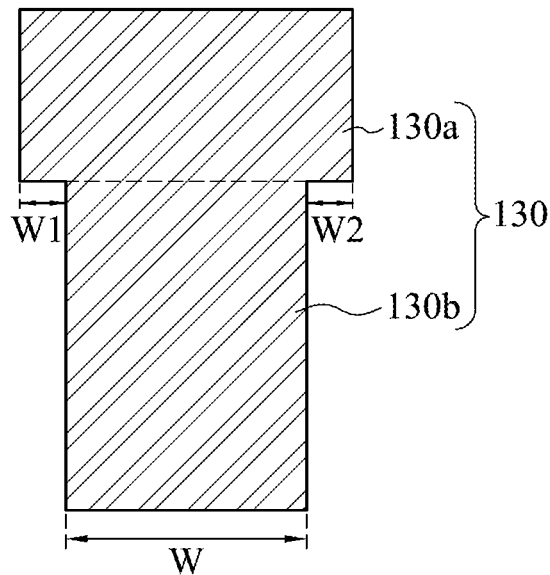
FIGS. 2A and 2B are schematic enlarged cross-sectional views of metal bumps according to one embodiment of this disclosure.
Figure 2B:
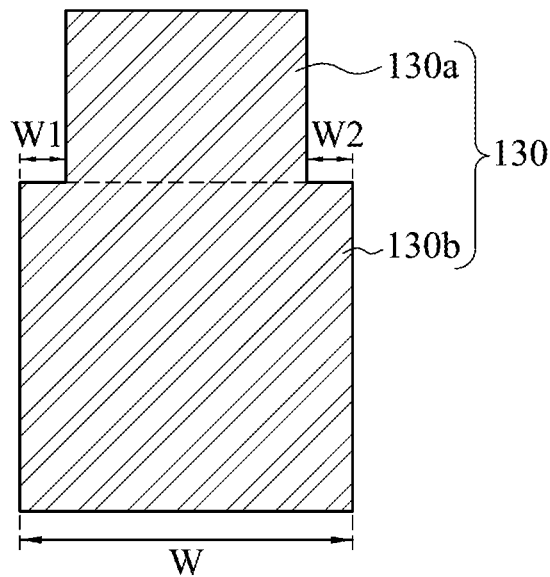

FIGS. 2A and 2B are schematic enlarged cross-sectional views of metal bumps according to one embodiment of this disclosure. As shown in FIG. 2A, when the edge of each of the openings 122 slightly protrude from the edge of the corresponding one of the openings 112, the width of the first part 130a is slightly greater than the width of the second part 130b, and the edge of the first part 130a is located outside a scope enclosed by the edge of the second part 130b. The difference between the widths of the openings 112 and 122 is less than 4% of the width of the openings 112, so the total length of the differences W1 and W2 between the widths of the first part 130a and the second part 130b is less than 4% of the width W of the second part 130b. As shown in FIG. 1B, the shape of the cross-section of each of the metal bumps 130 is similar to "I", in which the widths of different segments of each of the metal bumps 130 are substantially the same.

As shown in FIG. 2B, when the edge of each of the openings 122 slightly depress from the edge of the corresponding one of the openings 112, the width of the first part 130a is slightly less than the width of the second part 130b, and the edge of the first part 130a is located in a scope enclosed by the edge of the second part 130b. The difference between the widths of the openings 112 and 122 is less than 4% of the width of the openings 112, so the total length of the differences W1 and W2 between the widths of the first part 130a and the second part 130b is less than 4% of the width W of the second part 130b. As shown in FIG. 1B, the shape of the cross-section of each of the metal bumps 130 is similar to "I", in which the widths of different segments of each of the metal bumps 130 are substantially the same.

Figure 1C:
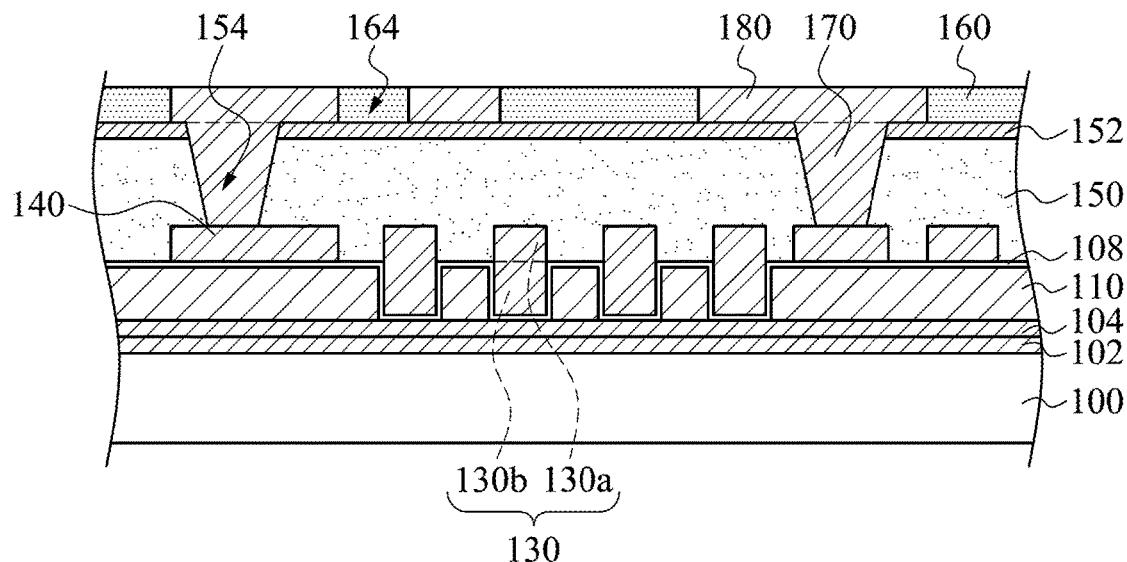
Figure 1C:
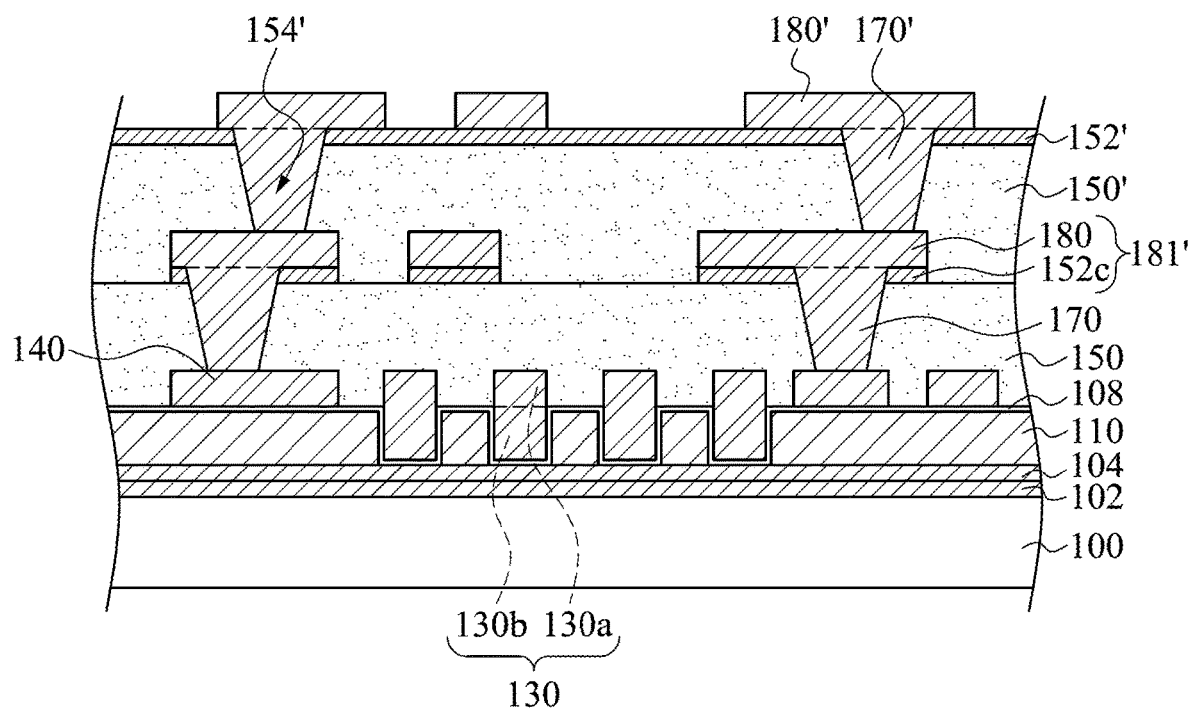

Then, as shown in FIG. 1B and FIG. 1C, after the patterned resist 120 is removed, a dielectric layer 150 is formed on the etching stop layer 108. The dielectric layer 150 covers the etching stop layer 108, the first parts 130a, and the circuit layer 140. The dielectric layer 150 is, for example, a prepreg. In this embodiment, the dielectric layer 150 is formed on the etching stop layer 108 by lamination. In addition, in this embodiment, a metal layer 152 may be formed on the dielectric layer 150. The metal layer 152 is, for example, a copper layer. Embodiments of this disclosure are not limited thereto. In other embodiments, the metal layer 152 may not be formed on the dielectric layer 150.

Then, a plurality of via holes 154 are formed in the dielectric layer 150 and the metal layer 152 to expose a part of the circuit layer 140. The forming method of the via holes 154 is, for example, laser ablation. Then, a patterned resist 160 is formed on the dielectric layer 150 and the metal layer 152. The patterned resist 160 has a pattern 164 to expose the via holes 154 and a part of the metal layer 152. Then, a metal layer is formed in the via holes 154 and the intaglioed pattern 164, such that a plurality of conductive vias 170 are formed in the via holes 154, and a patterned metal layer 180 is formed in the intaglioed pattern 164, in which the conductive vias 170 connect the circuit layer 140 and the patterned metal layer 180. The metal layer is, for example, a copper layer. The forming method of the metal layer is, for example, an electroplating process. Therefore, the dielectric layer 150, the conductive vias 170, and the patterned metal layer 180 form a build-up structure.

FIG. 1C' is a schematic cross-sectional view of one of the intermediate operations in the method for manufacturing the circuit board according to another embodiment of this disclosure. As shown in FIG. 1C', in another embodiment, after the patterned resist 160 and the metal layer 152 covered by the patterned resist 160 are removed to form the patterned metal layer 152c, a dielectric layer 150' is formed on the dielectric layer 150. The dielectric layer 150' covers the dielectric layer 150 and the patterned metal layer 180. The dielectric layer 150' is, for example, a prepreg. The dielectric layer 150 is formed on the dielectric layer 150 by lamination. A metal layer 152' may be formed on the dielectric layer 150'. The metal layer 152' is, for example, a copper layer. In addition, the patterned metal layer 180 and the metal layer 152c form a circuit layer 181'. Embodiments of this disclosure are not limited thereto. In other embodiments, the metal layer 152 may not be formed, and thus the metal layer 152c may not be formed. Therefore, the circuit layer 181' only includes the patterned metal layer 180.

Then, a plurality of via holes 154' are formed in the dielectric layer 150 and the metal layer 152' to expose a part of the circuit layer 181'. The forming method of the via holes 154' is, for example, laser ablation. A plurality of conductive vias 170' are formed in the via holes 154', and a patterned metal layer 180' is formed on the dielectric layer 150' and the metal layer 152', in which the conductive vias 170' connect the circuit layer 181' and the patterned metal layer 180'. The forming methods of the conductive vias 170' and the patterned metal layer 180' are the same with the forming methods of the conductive vias 170 and the patterned metal layer 180, so the details will not repeat here. Therefore, the dielectric layers 150 and 150', the conductive vias 170 and 170', the patterned metal layer 180', and the circuit layer 181' form a build-up structure. In addition, the dielectric layers 150 and 150' can be viewed as one dielectric layer in the structure perspective.

Therefore, as shown in FIG. 1C', the patterned metal layer 180' is formed on the dielectric layer 150'. The circuit layer 181' is formed between the dielectric layers 150 and 150'. The conductive vias 170 connect the circuit layer 140 and the circuit layer 181' (the lowermost one of the patterned metal layer 180' and the circuit layer 181'). The conductive vias 170' connect the circuit layer 181' and the patterned metal layer 180'.

The following process in this embodiment is similar to the following process in the embodiment of FIG. 1C, so the following processes in the embodiment of FIG. 1C are mainly discussed below.

Figure 1D:
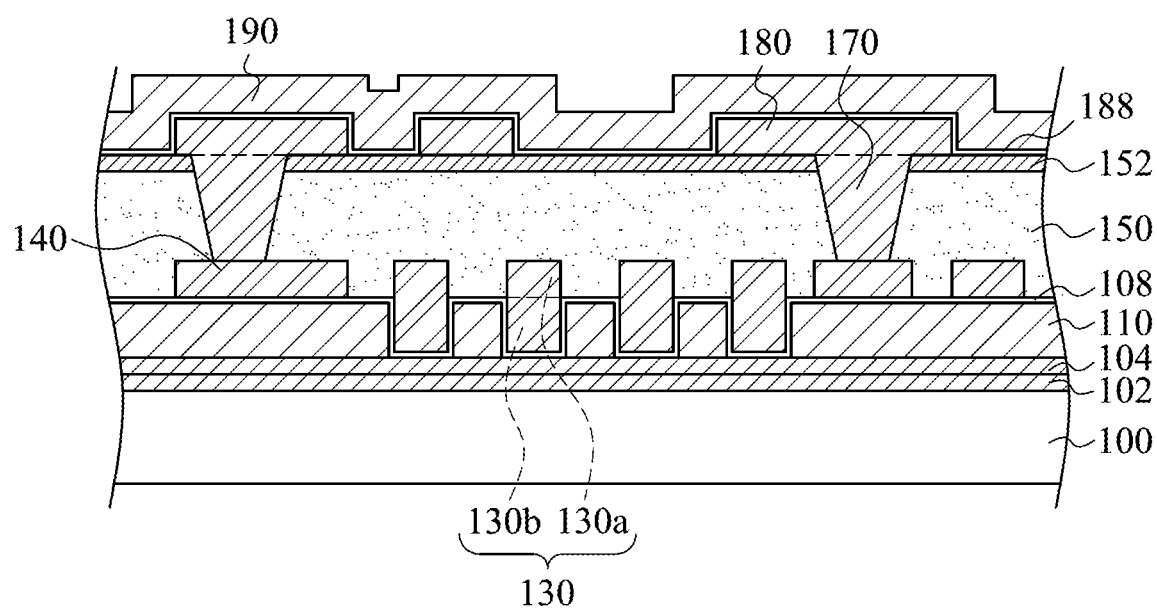

As shown in FIG. 1C and FIG. 1D, the patterned resist 160 is removed. Then, an etching stop layer 188 is formed on the dielectric layer 150 and the metal layer 152. The etching stop layer 188 covers the patterned metal layer 180 and a part of the metal layer 152. The etching stop layers 188 and 108 are made of the same material, i.e., tin, titanium, aluminum, or other metals that can form an intermetallic compound with copper. The formation method of the etching stop layer 188 is, for example, an electroplating process.

When the etching stop layer 188 is made of tin, the operation of forming the etching stop layer 188 includes the following detailed operations. First, a tin layer is formed on the dielectric layer 150, in which the tin layer covers the patterned metal layer 180 and a part of the metal layer 152. Then, the tin layer is heated. After the tin layer is heated, the tin layer will chemically react with the patterned metal layer 180 and the metal layer 152, which are made of copper, such that the tin layer becomes the etching stop layer 188 made of the copper-tin intermetallic compound.

After the patterned resist 160 is removed, the metal layer 152 is usually patterned (in FIG. 1C', the metal layer 152 is patterned to form the metal layer 152c). However, in this embodiment, since the tin layer will chemically react with the metal layer 152 to form the etching stop layer 188 made of the copper-tin intermetallic compound, the metal layer 152 will not be patterned after the patterned resist 160 is removed, and the metal layer 152 will be patterned in the following processes. When the etching stop layer 108 is made of titanium or aluminum, the metal layer 152 can be patterned after the patterned resist 160 is removed. Therefore, the etching stop layer 188 will be formed on the dielectric layer 150 and the patterned metal layer 180.

Then, a sacrificial metal layer 190 is formed on the etching stop layer 188. The sacrificial metal layer 190 is, for example, a copper layer. Embodiments of this disclosure are not limited thereto. The forming method of the sacrificial metal layer 190 is, for example, an electroplating process. Further, the thickness of the sacrificial metal layer 110 is substantially the same with the thickness of the sacrificial metal layer 190. In some embodiments, the thickness of the sacrificial metal layers 110 and 190 is in a range from about 10 μm to about 30 μm. In addition, the sacrificial metal layers 110 and 190 are made of the same material.

Figure 1E:
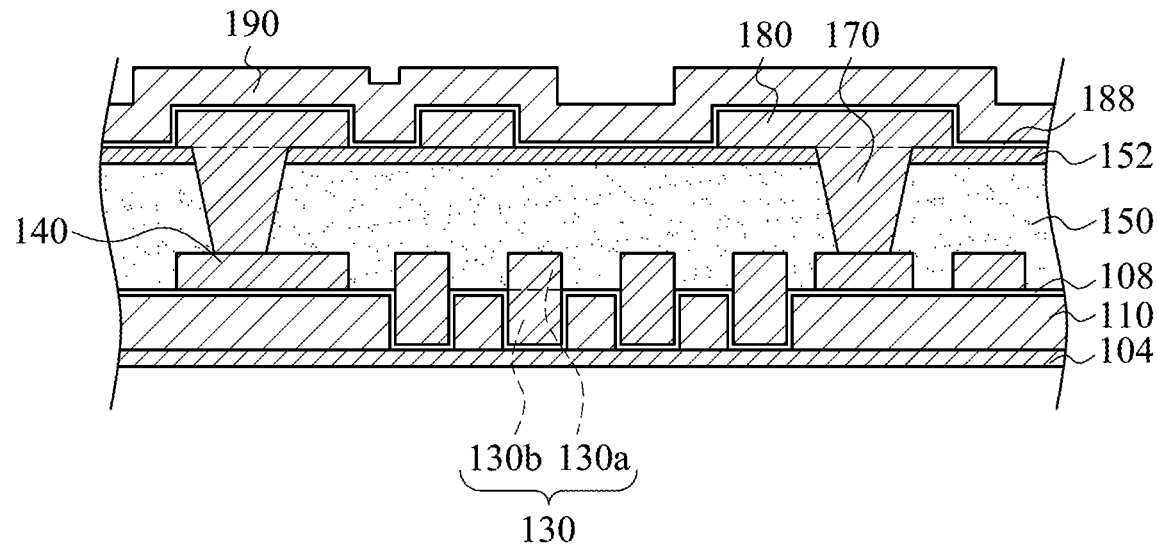

Then, as shown in FIG. 1D and FIG. 1E, the carrier 100 and the sacrificial metal layer 110 are separated. In this embodiment, because the copper foil layers 102 and 104 are disposed on the carrier 100, the copper foil layer 102 can be easily stripped from the copper foil 104 by the stripping layer (not shown in Figs.) to separate the carrier 100 and the sacrificial metal layer 110 during the process of separating the carrier 100 and the sacrificial metal layer 110.

Figure 1F:
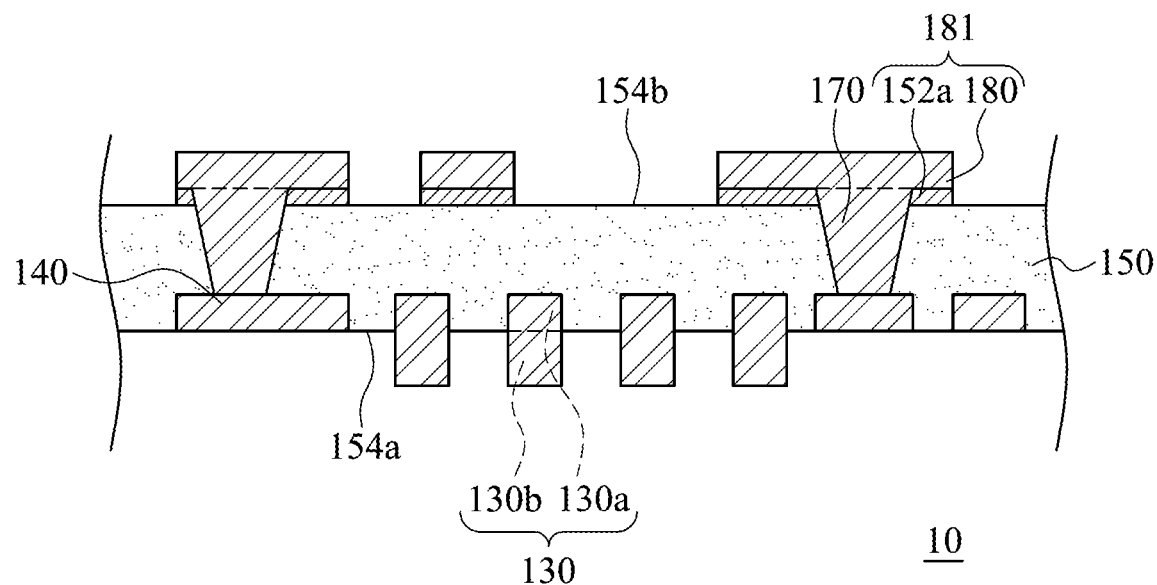

Then, as shown in FIG. 1F, a first etching process is performed to remove the sacrificial metal layers 110 and 190. In this embodiment, the copper foil layer 104 located below the sacrificial metal layer 110 is removed to expose the etching stop layer 108 when the sacrificial metal layers 110 and 190 are removed.

The first etching process is an alkaline etching process. Because the etching stop layers 108 and 118 are made of tin, titanium, aluminum, or other metals that can form an intermetallic compound with copper, the etching stop layers will not be influenced by the first etching process. Compared to the conventional material nickel, tin, titanium, aluminum, or other metals that can form an intermetallic compound with copper can resist the alkaline etching more effectively, so the cavity will not be formed in the etching stop layers 108 and 118 after the first etching process is performed, such that depressions or cavities may not be generated in the metal bumps 130, the circuit layer 140, and the patterned metal layer 180, and an open circuit will not happen.

Further, because the thickness of the sacrificial metal layer 110 is substantially the same with the thickness of the sacrificial metal layer 190, and the sacrificial metal layers 110 and 190 are made of the same material, the time needed to remove the sacrificial metal layer 110 and the time needed to remove the sacrificial metal layer 190 are approximately the same. Therefore, each of the sacrificial metal layers 110 and 190 will not be removed ahead of the other, such that the time that each of the etching stop layers 108 and 188 is influenced by the first etching process will not be longer than the time that the other of the etching stop layers 108 and 188 is influenced by the first etching process, and thus defects will not be generated in each of the etching stop layers 108 and 188.

Then, a second etching process is performed to remove the etching stop layers 108 and 188. In the second etching process, the etchant only etches the etching stop layers 108 and 188 without damaging the circuit layer 140, the patterned metal layer 180, and the metal bumps 130. In this embodiment, after the sacrificial stop layers 108 and 188 are removed, a third etching process is performed to remove a part of the metal layer 152 to form a patterned metal layer 152a, and the patterned metal layer 180 and the metal layer 152a form a circuit layer 181. Therefore, a circuit board 10 is formed.

As shown in FIG. 1F, in another aspect of the disclosure, the circuit board 10 includes a dielectric layer 150, circuit layers 140 and 181, a plurality of conductive vias 170, and a plurality of metal bumps 130. The dielectric layer 150 has a surface 154a and a surface 154b opposite to the surface 154a. The circuit layer 140 is buried in the surface 154a, and the end surface of the circuit layer 140 exposed by the surface 154a may be optionally coplanar with the surface 154a. Embodiments of this disclosure are not limited thereto. In addition, the circuit layer 181 is disposed on the surface 154b. The conductive vias 170 are disposed in the dielectric layer 150 and connect the circuit layers 140 and 181.

As shown in FIG. 1F, each of the metal bumps 130 has a first part 130a and a second part 130b. The first part 130a is disposed in the dielectric layer 150, and the second part 130b protrudes from the surface 154a. In addition, the end surface of the first part 130 may be optionally coplanar with an interface between the circuit layer 140 and one of the conductive vias 170.

Embodiments of this disclosure are not limited thereto. The shape of the cross-section of each of the metal bumps 130 is similar to "I", in which the widths of different segments of each of the metal bumps 130 are substantially the same. Therefore, the metal bumps 130 will not occupy the surrounding space, so the space for the circuit layer can be effectively increased.

FIGS. 3A to 3E are schematic cross-sectional views of the intermediate operations in the method for manufacturing the circuit board according to another embodiment of this disclosure. The embodiment in FIG. 3A to FIG. 3E is similar to the embodiment in FIG. 1A to FIG. 1F. Therefore, the differences are mainly discussed below. The description of the omitted parts can be referred to the aforementioned embodiments, and the omitted parts will not repeat below. In addition, the same element or similar elements will use the same reference numerals.

Figure 3A:
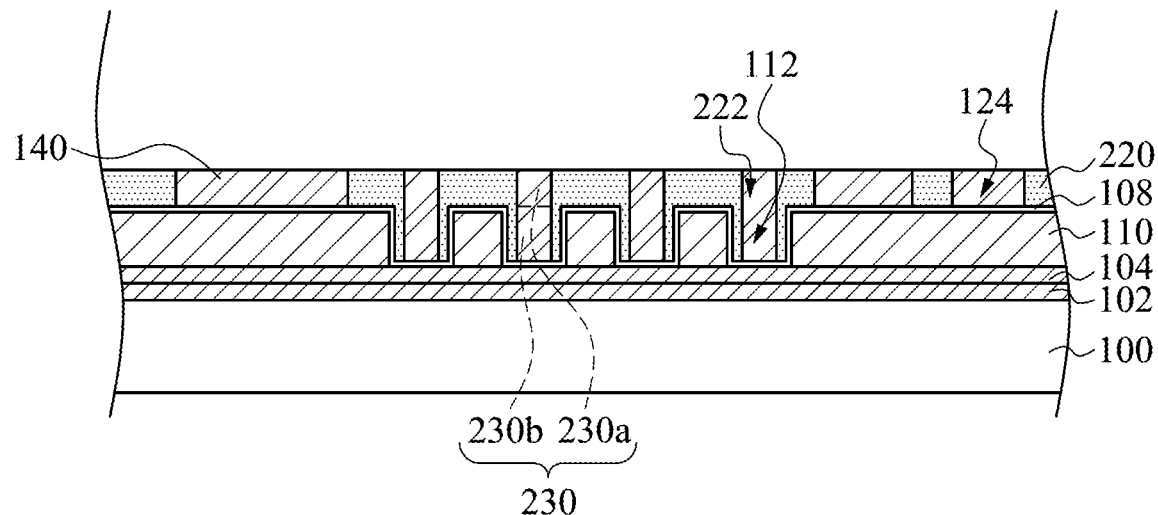
FIGS. 3A to 3E are schematic cross-sectional views of the intermediate operations in the method for manufacturing the circuit board according to another embodiment of this disclosure.

As shown in FIG. 3A, after the operation described in FIG. 1A, a patterned resist 220 is formed on the etching stop layer 108. The patterned resist 220 has an intaglioed pattern 124 to expose a part of the etching stop layer 108 as well. However, the difference between the patterned resists 120 and 220 is that the patterned resist 220 covers the sidewalls of the openings 112 to form a plurality of openings 222. Therefore, the width of the openings 222 is less than the width of the openings 112.

Then, a metal layer is formed in the openings 222 and the intaglioed pattern 124, such that a plurality of metal bumps 230 are formed in the openings 222 and a circuit layer 140 is formed in the intaglioed pattern 124. The metal layer is, for example, a copper layer. The forming method of the metal layer is, for example, an electroplating process. Each of the metal bumps 230 has a first part 230a and a second part 230b. The deposition height of the first part 230a is substantially the same with the deposition height of the circuit layer 140, and the second part 230b is disposed in the openings 112. Because the patterned resist 220 covers the sidewalls of the openings 112 to form the openings 222, the widths of the first part 230a and the second part 230b are the same. In other words, the shape of the cross-section of each of the metal bumps 230 is similar to "I".

In addition, because the width of the openings 222 is less than the width of the openings 112, the width of the metal bumps 230 is less than the width of the metal bumps 130 in the aforementioned embodiment. Embodiments of this disclosure are not limited thereto. The width of the openings 112 and the thickness of the patterned resist 220 covering the sidewalls of the openings 112 may be adjusted according to actual requirements to adjust the width of the openings 222, such that the width of the metal bumps 230 formed in the openings 222 can further be adjusted.

Figure 3B:
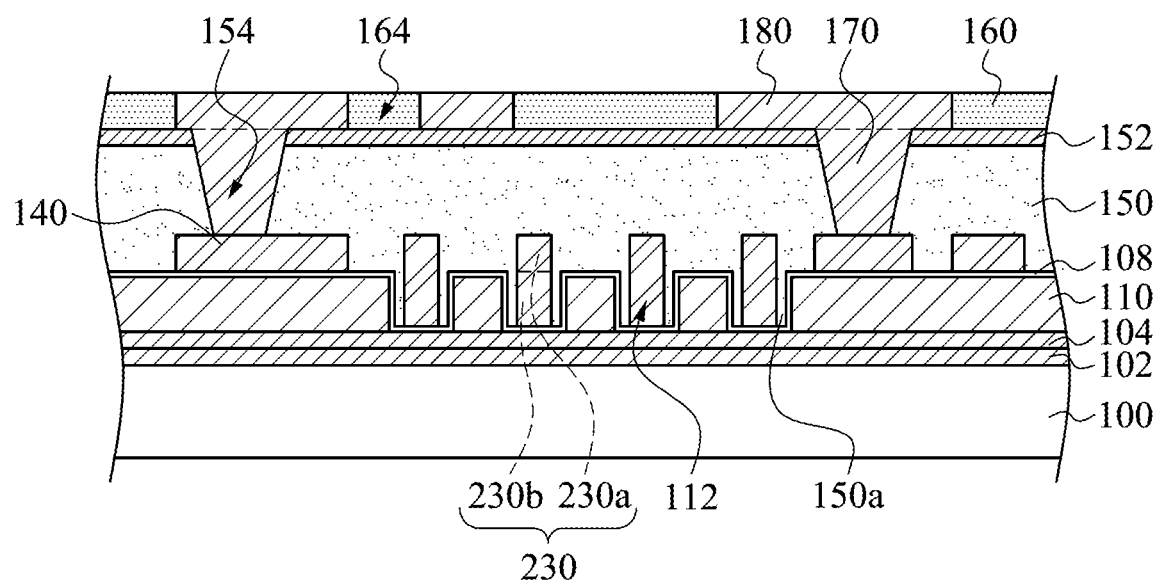

Then, as shown in FIG. 3A and FIG. 3B, after the patterned resist 220 is removed, a dielectric layer 150 is formed on the etching stop layer 108. The dielectric layer 150 covers a part of the etching stop layer 108, the first parts 230a, and the circuit layer 140, and a part of the dielectric layer 150 (the dielectric layer 150a) is filled in the openings 112 and located in gaps between the second parts 230b and the openings 112. In other words, the dielectric layer 150a is disposed on the sidewalls of the second parts 230b and covers a part of the etching stop layer 108. By adjusting the thickness of the patterned resist 220 covering the sidewalls of the openings 112, the thickness of the dielectric layer 150a may be adjusted. Therefore, the thickness of the dielectric layer 150a may be optionally reduced to minimum according to actual requirements, such that the dielectric layer 150a will not influence the performance of the circuit board formed in the following processes. The dielectric layer 150 is, for example, a prepreg. In this embodiments, the dielectric layer 150 is formed on the etching stop layer 108 by lamination. In addition, similar to the aforementioned embodiment, a metal layer 152 may be formed on the dielectric layer 150.

Then, a plurality of conductive vias 170 are formed in the dielectric layer 150, and a patterned metal layer 180 is formed on the dielectric layer 150, in which the conductive vias 170 connect the circuit layer 140 and the patterned metal layer 180. The associated processes of forming the conductive vias 170 and the patterned metal layer 180 are described in the aforementioned embodiment, so the detail will not repeat here. Therefore, the dielectric layer 150, the conductive vias 170, and the patterned metal layer 180 form a build-up structure.

Figure 3C:
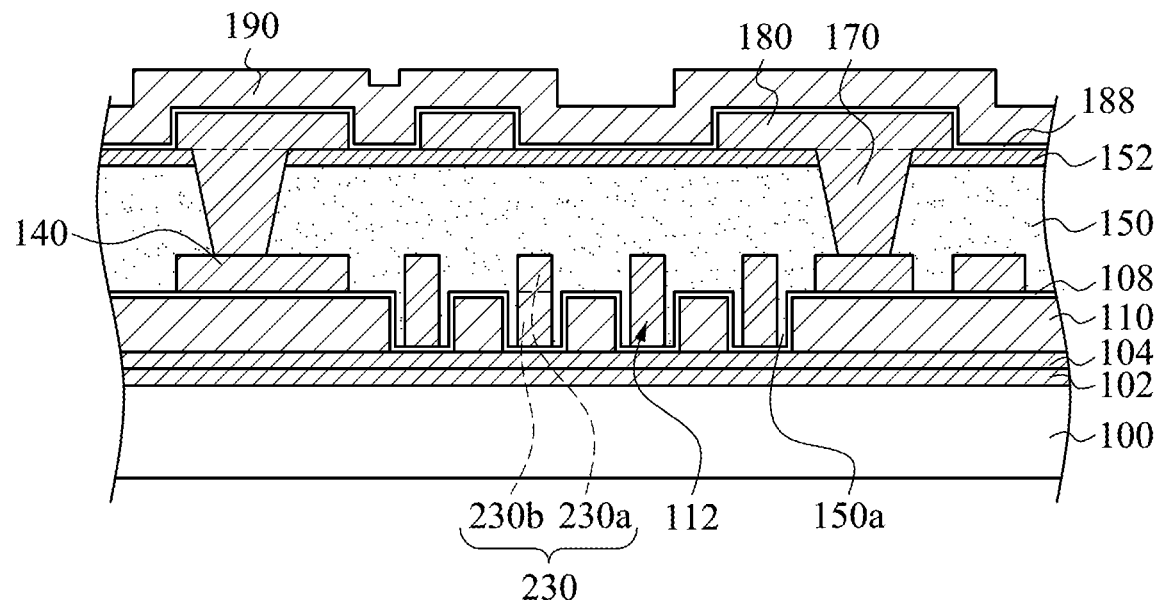

Then, as shown in FIG. 3B and FIG. 3C, similar to the operations described in FIG. 1D, the patterned resist 160 is removed. Then, an etching stop layer 188 is formed on the dielectric layer 150 and the metal layer 152. The etching stop layer 188 covers the patterned metal layer 180 and a part of the metal layer 152.

Then, a sacrificial metal layer 190 is formed on the etching stop layer 188. The associated processes of forming the sacrificial metal layer 190 are described in the aforementioned embodiment, so the detail will not repeat here.

Figure 3D:
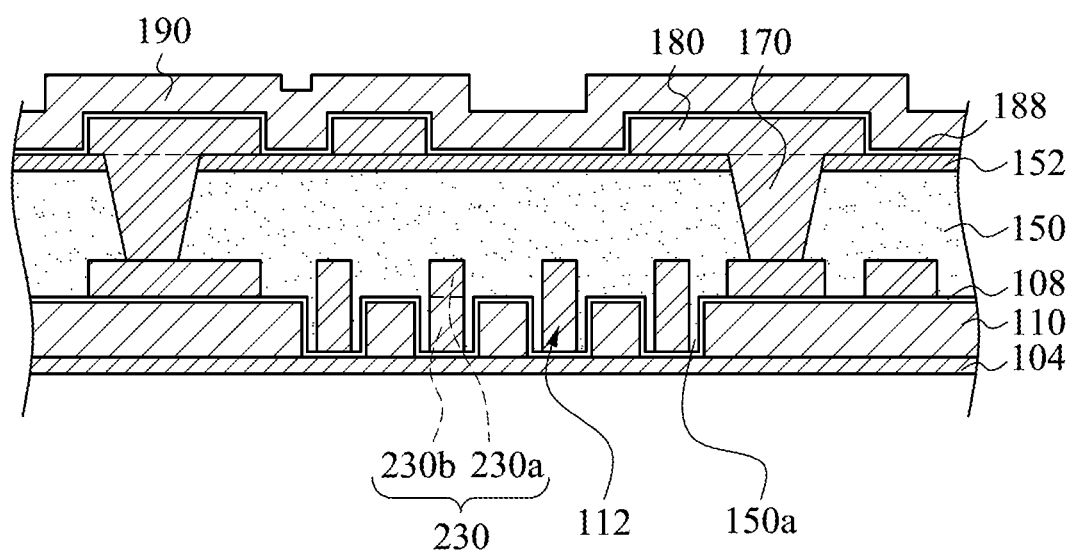

Then, as shown in FIG. 3C and FIG. 3D, similar to the operations described in FIG. 1E, the carrier 100 and the sacrificial metal layer 110 are separated.

Figure 3E:
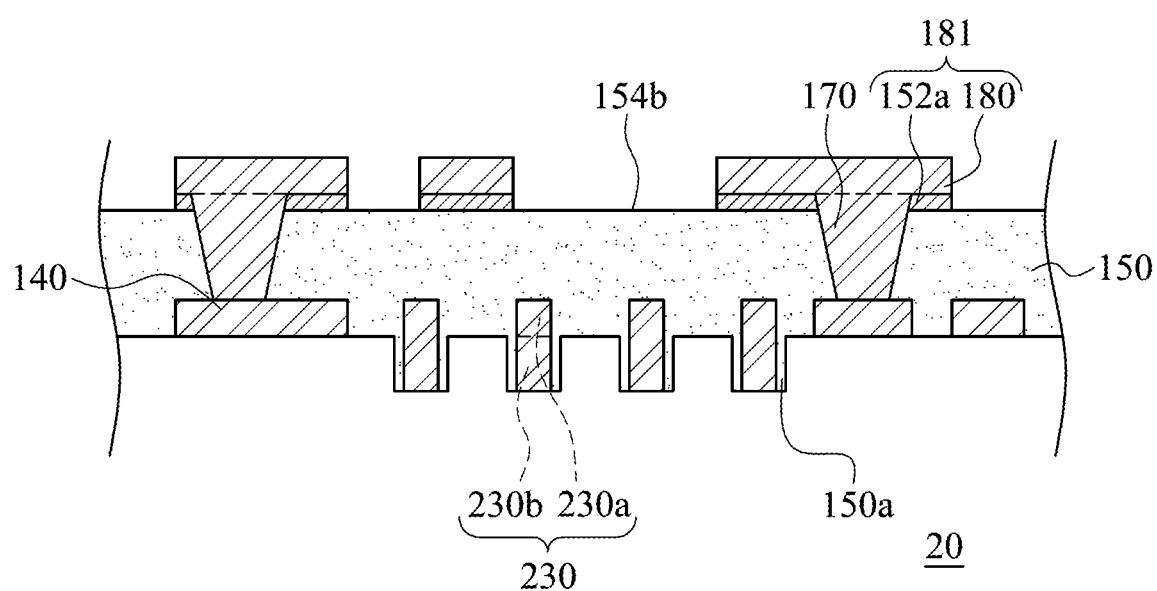

Then, as shown in FIG. 3D and FIG. 3E, similar to the operations described in FIG. 1F, the sacrificial metal layer 110 and 190 are removed. Similar to the aforementioned embodiment, the sacrificial metal layers 110 and 190 are removed, and the copper foil layer 104 disposed below the sacrificial metal layer 110 is removed as well to expose the etching stop layer 108. Then, a second etching process is performed to remove the etching stop layers 108 and 188. In this embodiment, after the sacrificial stop layers 108 and 188 are removed, a third etching process is performed to form a patterned metal layer 152a, and the patterned metal layer 180 and the metal layer 152a form a circuit layer 181. Therefore, a circuit board 20 is formed.

As shown in FIG. 3E, in another aspect of the disclosure, similar to the circuit board 10 of FIG. 1F, the circuit board 20 includes a dielectric layer 150, circuit layers 140 and 181, a plurality of conductive vias 170, and a plurality of metal bumps 230. The width of the first parts 230a of the metal bumps 230 is the same with the width of the second part 230b of the metal bumps 230b, and the shape of the cross-section of each of the metal bumps 130 is similar to "I". However, the difference between the circuit boards 10 and 20 is that the width of the metal bumps 230 of the circuit board 20 is less than the width of the metal bumps 130 of the circuit board 10. Therefore, the space for the circuit layer can be effectively increased, and the circuit board 20 may be further miniaturized. In addition, the circuit board 20 further includes the dielectric layer 150a, and the dielectric layer 150a is disposed on the sidewalls of the second parts 230b.

All the features disclosed in this specification (including any accompanying claims, abstract, and drawings) may be replaced by alternative features serving the same, equivalent or similar purpose, unless expressly stated otherwise. Thus, unless expressly stated otherwise, each feature disclosed is one example only of a generic series of equivalent or similar features.

Any element in a claim that does not explicitly state "means for" performing a specified function, or "step for" performing a specific function, is not to be interpreted as a "means" or "step" clause as specified in 35 U.S.C. § 112, 6th paragraph. In particular, the use of "step of" in the claims herein is not intended to invoke the provisions of 35 U.S.C. § 112, 6th paragraph.

What is claimed is:

1. A circuit board, comprising:
   a first dielectric layer having a first portion and a second portion, wherein the first portion has a first surface and a second surface opposite to the first surface;
   a first circuit layer buried in the first surface;

a second circuit layer disposed on the second surface;
a conductive via disposed in the first dielectric layer and connecting the first circuit layer and the second circuit layer; and
a metal bump having a first part and a second part, wherein the first part is disposed in the first dielectric layer, the second part protrudes from the first surface, the second portion of the first dielectric layer extends from the first surface of the first portion of the first dielectric layer to a sidewall of the second part of the metal bump, the sidewall of the second part of the metal bump is entirely covered by the second portion of the first dielectric layer, and a difference between widths of the first part and the second part is less than 4% of the width of the second part.

* * * * *